(12) United States Patent
Suzuki et al.

(10) Patent No.: US 6,641,934 B1
(45) Date of Patent: Nov. 4, 2003

(54) HIGH DENSITY INFORMATION RECORDING MEDIUM, AND MANUFACTURING METHOD OF THE SAME MEDIUM

(75) Inventors: Toshio Suzuki, Akita (JP); Naoki Honda, Akita (JP); Kazuhiro Ouchi, Akita-ken (JP)

(73) Assignee: Governor of Akita Prefecture, Akita-Ken (JP)

( * ) Notice: Subject to any disclaimer, the term of this patent is extended or adjusted under 35 U.S.C. 154(b) by 0 days.

(21) Appl. No.: 09/641,811

(22) Filed: Aug. 17, 2000

(30) Foreign Application Priority Data

Sep. 29, 1999 (JP) .............................. 11-276414

(51) Int. Cl.[7] .............................. G11B 5/66; G11B 5/20; C23C 14/34
(52) U.S. Cl. ..................... 428/694 TS; 428/694 TM; 428/900; 204/192.2; 204/298.12
(58) Field of Search .................. 428/694 TM, 900, 428/65.3, 694 TS; 204/192.2, 298.12, 192.1

(56) References Cited

U.S. PATENT DOCUMENTS

| | | | | |
|---|---|---|---|---|
| 4,576,876 A | * | 3/1986 | Shiiki et al. ................ 428/679 |
| 4,687,712 A | * | 8/1987 | Sugita et al. ............... 428/611 |
| 4,814,053 A | * | 3/1989 | Shimokawato ......... 204/192.15 |
| 5,543,221 A | * | 8/1996 | Kitakami et al. .......... 428/332 |
| 5,820,963 A | * | 10/1998 | Lu et al. ..................... 428/65.3 |
| 6,007,623 A | * | 12/1999 | Thiele et al. ................ 117/95 |
| 6,068,739 A | | 5/2000 | Suzuki et al. ........... 204/192.2 |

FOREIGN PATENT DOCUMENTS

JP  10-162318  6/1998

OTHER PUBLICATIONS

Suzuki et al., "Fe–Pt Media for Perpendicular Magnetic Recording", IEEE Trans. Magn., vol. 35, No. 5, Sep. 1999.*
Suzuki, T. et al., "Magnetization Reversal Process in Polycrystalline Ordered Fe–Pt (001) Thin Films," Journal of Applied Physics, vol. 85, No. 8, Part 2, Apr. 1999, pp. 4301–4303.

(List continued on next page.)

Primary Examiner—Holly Rickman
(74) Attorney, Agent, or Firm—Christensen O'Connor Johnson Kindness PLLC

(57) ABSTRACT

To present an information recording medium for achieving high density information recording, in particular, a high signal output and a high resolution in magnetic recording, for example, an information recording medium sequentially forming a layer made of soft magnetic material, a layer made of nonmagnetic material, and an information recording layer of ordered alloy with $L1_0$ crystal structure selected from group A is manufactured in a specified manufacturing method. Herein the group A is defined to include FePt ordered alloy, CoPt ordered alloy, FePd ordered alloy, and their alloy.

8 Claims, 9 Drawing Sheets

OTHER PUBLICATIONS

Iwasaki, S. et al., "Perpendicular Magnetic Recording With A Composite Anisotropy Film," IEEE Transaction on Magnetics, vol. MAG–15, No. 6, Nov. 1979, pp. 1456–1458.

Nakamura, Y. et al., "The Effect of Magnet Interaction Between Medium and Head on Perpendicular Magnetic Recording Characteristics," IEEE Transactions on Magnetics, vol. MAG–22, No. 5, Sep. 1986, pp. 376–378.

Nakamura, Y. et al., "Recording Characteristics of Perpendicular Magnetic Hard Disk Measured by Non–Flying Single–Pole Head," IEEE Transaction on Magnetics, vol. 26, No. 5, Sep. 1990, pp. 2436–2438.

Iwasaki, S. et al., "An Analysis for the Magnetization Mode for High Density Magnetic Recording," IEEE Transactions on Magnetics, vol. MAG–13. No. 5, Sep. 1997.

Suzuki, T. et al., "New Fe–Pt Media for Perpendicular Magnetic Recording," Digests of Intermag 99, 1999 IEEE International Magnetics Conference, May 18–21, 1999 Kyongju, Korea.

Suzuki, T. et al., "Preparation and Magnetic Properties of Sputter–Deposited Fe–Pt Thin Films with Perpendicular Anisotropy," Journal of The Magnetics Society of Japan, vol. 21, Supplement, No. S2 (1997).

* cited by examiner

HIGH DENSITY INFORMATION RECORDING MEDIUM, AND MANUFACTURING METHOD OF THE SAME MEDIUM

CROSS-REFERENCE TO RELATED APPLICATIONS

This application is based upon and claims the benefit of priority from the prior Japanese Patent Application No. 11-276414, filed Sep. 29, 1999, the entire contents of which are incorporated herein by reference.

BACKGROUND OF THE INVENTION

The present invention relates to a high density recording technology, and more particularly to a magnetic recording medium having a layer structure for achieving a high signal output and a high recording resolution, and a manufacturing method of the same medium.

Recently, the magnetic recording medium has been intensively researched and developed as means of recording a huge quantity of information, and, in particular, the magnetic recording medium used in the hard disk device for computer is rapidly advanced in the areal recording density.

At the present, in this recording medium, the recording method of recording a signal by directing the magnetization vector in the in-plane direction of the recording film known as longitudinal magnetic recording is employed, but as a recording-method for realizing much higher recording density, perpendicular magnetic recording for recording a signal by directing the magnetization vector in the perpendicular direction of the recording film is attracting attention (see S. Iwasaki and Y. Nakamura, IEEE Trans. Magn., vol. MAG-13, pp. 1272–1277, 1997).

As the magnetic recording material, in either recording method, the Co—Cr alloy is mainly used in the recording layer. At this time, by a material, a crystal orientation, or a lattice constant of an underlayer, the crystal orientation of the Co-Cr alloy placed immediately on its underlayer can be controlled. It is therefore possible to control the direction of the easy axis of magnetization to determine the direction of magnetization vector. At the present it is intensively researched and developed about the longitudinal recording medium or perpendicular recording medium using the Co—Cr alloy thin film fabricated by such technique as the information recording layer.

By contrast to the information recording medium using the Co—Cr alloy thin film, Japanese Patent Application No. 10-162318 discloses layer structures of perpendicular magnetic recording media using a thin film of ordered alloy with $L1_0$ crystal structure excellent in thermal stability and large in magnetocrystalline anisotropy as shown in FIG. 10A, FIG. 10B, and its manufacturing method. According to this manufacturing method, the perpendicular magnetic recording medium is an information recording medium comprising an underlayer 40 mainly made of an element or a compound selected from Cr, Pt, Pd, Au, Fe, Ni, MgO or NiO, and an information recording layer 10 made of a thin film of ordered alloy with $L1_0$ crystal structure (hereinafter, the medium composed as shown in FIG. 10A is called single-layer perpendicular magnetic recording medium).

Further, for control of recording characteristic, the perpendicular magnetic recording medium is an information recording medium comprising a layer 30 made of Fe, FeSi alloy, permalloy or other soft magnetic material, and an information recording layer 10 made of a thin film of ordered alloy with $L1_0$ crystal (hereinafter, the medium composed as shown in FIG. 10B is called double-layer perpendicular magnetic recording medium).

This double-layer perpendicular magnetic recording medium is known to be increased in the signal output as compared the single-layer perpendicular magnetic recording medium, as reported by T. SUZUKI, N. HONDA, and K. OUCHI (1999 Digests of INTERMAG 99, AT-07).

In such double-layer perpendicular magnetic recording medium, however, as compared with the single-layer perpendicular magnetic recording medium, the signal output depends more on the recording density, and the recording density at which the signal output becomes half at low recording density (hereinafter called the resolution) is decreased, and this phenomenon is not preferred in high density recording using an actual signal output system.

So far, nothing has been proposed about the perpendicular magnetic recording medium using a thin film of ordered alloy with $L1_0$ crystal structure large in magnetocrystalline anisotropy satisfying both high signal output and high resolution.

It is hence an object of the invention to present an information recording medium having a high signal output and a high resolution, using a thin film of ordered alloy with $L1_0$ crystal structure large in magnetocrystalline anisotropy.

BRIEF SUMMARY OF THE INVENTION

The invention is devised in the light of the present situation described above, and provides the following means for solving the problems and achieving the object.

A first aspect of the invention proposes a magnetic recording medium composed of a novel layer structure using a thin film of ordered alloy with $L1_0$ crystal structure achieving a high signal output and a high recording resolution as an information recording layer, and a manufacturing method of such medium, as set forth in the scope of claims.

As the magnetic recording medium, it is intended to present an information recording medium characterized by [1] having a layer structure sequentially forming a layer made of soft magnetic material, a layer made of nonmagnetic material, and information recording layer of ordered alloy with $L1_0$ crystal structure selected from group A (FePt ordered alloy, CoPt ordered alloy, FePd ordered alloy, and their alloy).

This information recording medium is the recording medium of [1], formed so that the Miller index (001) of the crystal lattice plane of the information recording layer of ordered alloy with $L1_0$ crystal structure selected from group A may be parallel to the plane of the recording layer.

It is also a feature of the recording medium of [1] that the nonmagnetic material is MgO. Or, in the recording medium of [1], the soft magnetic material is selected from group B (Fe, Fe—Si alloy, Ni—Fe alloy).

As a manufacturing method of this information recording medium, the invention presents a manufacturing method of information recording medium characterized by [5] sequentially manufacturing soft magnetic layer, nonmagnetic layer, and information recording layer of ordered alloy of $L1_0$ crystal structure selected from group A (FePt ordered alloy, CoPt ordered alloy, FePd ordered alloy, and their alloy).

This manufacturing method, in fabrication of the information recording layer of ordered alloy of $L1_0$ crystal structure, is the manufacturing method of [5], characterized by fabricating this information recording layer of ordered alloy of $L1_0$ crystal structure by the sputter deposition method using the sputtering target fabricated by melting method.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention presents a magnetic recording medium having a novel layer structure for achieving a high signal output and a high recording resolution, and a manufacturing method for forming a novel layer structure of such recording medium, and preferred embodiments of the invention are presented below, and plural examples corresponding to them are specifically described below.

Figure 1A:
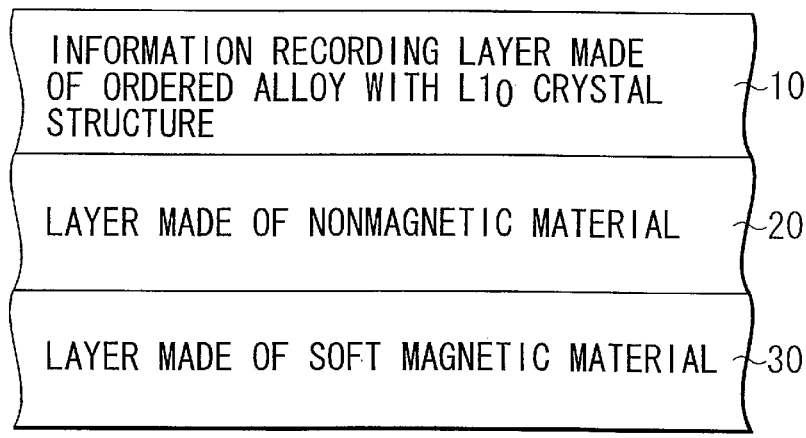
FIGS. 1A to 1C are basic layer structural diagrams of an information recording medium of the invention.

In the information recording medium for recording and reproducing information by using magnetism, in particular, it is one of the features of the information recording medium of the invention, as shown in FIG. 1A, that it has a layer structure sequentially forming a layer 30 made of a soft magnetic material, a layer 20 made of a nonmagnetic material, and an information recording layer 10 of ordered alloy with $L1_0$ crystal structure selected from group A as specified below. That is, group A is defined to include FePt ordered alloy, CoPt ordered alloy, FePd ordered alloy, and their alloy.

It is also a feature of the invention, as shown in FIG. 1A, that the information recording layer 10 of ordered alloy with $L1_0$ crystal structure high in the magnetocrystalline anisotropy selected from group A is used in order to obtain a information recording medium excellent in the thermal stability. At this time, the film thickness of the information recording layer 10 of ordered alloy with $L1_0$ crystal structure may be determined from the viewpoint of recording and reproducing characteristics, and the thickness is not particularly specified, but it may be designed in a range of about 5 to 200 nm.

Figure 1B:
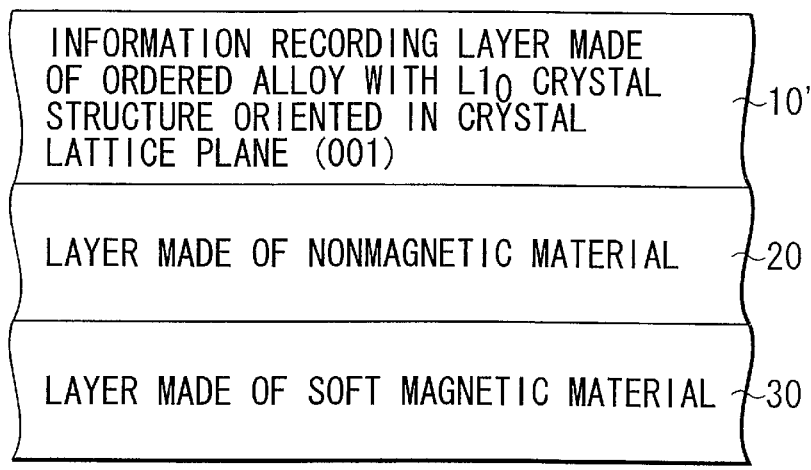

It is also one of the features of the information recording medium of the invention, as shown in FIG. 1B, that the Miller index (001) of the crystal lattice plane of the information recording layer of ordered alloy with $L1_0$ crystal structure selected from group A is controlled so as to be parallel to other adjacent layers and substrate.

Since the information recording medium of the invention includes the layer 30 made of soft magnetic material, the magnetic recording head used in information recording can induce the perpendicular magnetic field composed of a narrow magnetic field distribution on the recording medium. Therefore, if the magnetization vector of the thin film of ordered alloy with $L1_0$ crystal structure which is the information recording layer (10') to be used is controlled to be perpendicular to the film surface, that is, the Miller index (001) of the crystal lattice plane to be parallel to the substrate, the steep perpendicular magnetic field can be utilized effectively and the high density recording characteristic is extremely enhanced, which is particularly preferred for the high density recording medium.

Figure 1C:
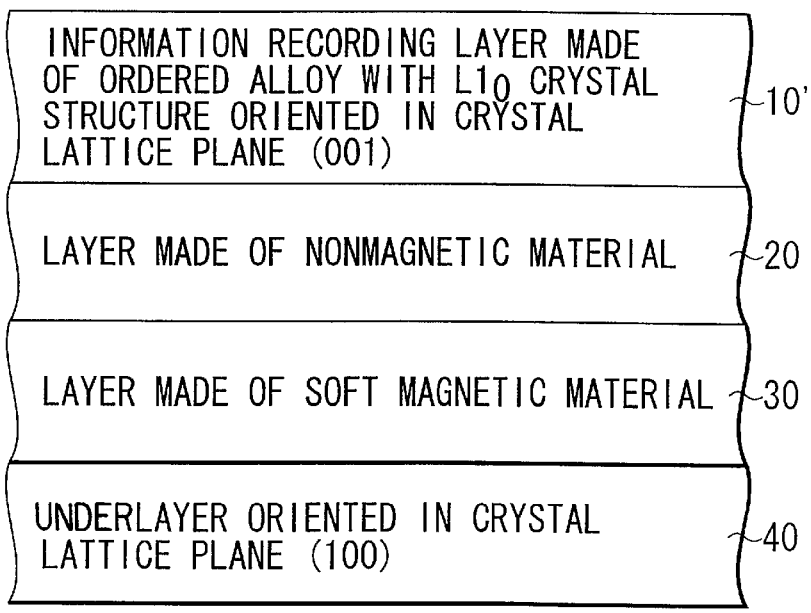

At this time, for example as shown in FIG. 1C, the underlayer 40 is mainly composed of an element or compound selected from Cr, Pt, Pd, Au, Fe, Ni, MgO or NiO controlled so that the Miller index (100) of the crystal lattice plane may be parallel to other adjacent layers and substrate, and further the layer structure of the invention is formed, that is, the layer 30 made of soft magnetic material, layer 20 made of nonmagnetic material, and information recording layer 10' of ordered alloy with $L1_0$ crystal structure are sequentially formed, and therefore the Miller index (001) of the crystal lattice plane of the information recording layer of ordered alloy with $L1_0$ crystal structure can be controlled to be parallel to other adjacent layers and substrate.

The information recording medium of the invention includes the layer 20 made of nonmagnetic material and hence a high resolution is realized. This layer 20 made of nonmagnetic material adjusts the magnetic TEA interaction between the layer 30 made of soft magnetic material and the thin film of ordered alloy with $L1_0$ crystal structure, and improves the magnetic characteristics, for example, increases the coercivity of the information recording layer 10 (10') of ordered alloy with $L1_0$ crystal structure. Depending on the nonmagnetic material to be selected, moreover, it is also possible to control the crystallinity and crystal orientation of the thin film of ordered alloy with $L1_0$ crystal structure.

The layer 20 made of nonmagnetic material is preferred not to be alloyed with either the layer 30 made of soft material layer or the thin film layer 10 (10') of ordered alloy with $L1_0$ crystal structure, and made of MgO, in particular, it brings about a notable effect for enhancement of resolution. Moreover, when MgO is used, the crystallinity and crystal orientation of the thin film layer 10 (10') of ordered alloy with $L1_0$ crystal structure can be improved, and the film thickness of the information recording layer 10 (10') can be decreased. Therefore, the magnetic field distribution of the magnetic head used in information recording can be narrowed, and its strength can be intensified, so that it is expected to improve the recording characteristics, too.

The film thickness of the layer 20 made of nonmagnetic material may be properly designed in combination with the layer 30 made of soft magnetic material and the information recording layer 10 (10') of ordered alloy with $L1_0$ crystal structure, and at least it is preferred to define the film thickness so as not to spoil the recording magnetic field generated by the magnetic head used in information recording, for example, about 10 nm or less.

Herein, the "nonmagnetic material" of the invention refers to a material showing diamagnetism, paramagnetism or antiferromagnetism at room temperature.

The layer 30 made of soft magnetic material in the invention can be selected properly from alloy, oxide, multilayer film, and granular film, depending on the saturation magnetization of the thin film 10 (10') of ordered alloy with $L1_0$ crystal structure to be used together, the magnetic head used in information recording, or recording and reproducing system. For example, by using Fe or Fe alloy having a high saturation magnetization, specifically, Fe—Si alloy (for example, containing Si by 1.5 wt. %), or Ni—Fe alloy (for example, with the composition ratio by weight of Ni/Fe=1), the soft magnetic material is formed in a thinner film, or by using a Ni-Fe alloy with a high magnetic permeability (for example, with the composition ratio by weight of Ni/Fe=4), a high recording sensitivity is obtained. Hence, Fe, Fe—Si alloy, and Ni—Fe alloy are particularly preferred. Besides, by using an amorphous alloy, for example, Co—Zr—Nb alloy, the surface smoothness of the recording medium can be enhanced, and damage of magnetic head used in information recording and reproducing can be reduced, and hence it is preferred to use such materials.

The film thickness of the layer 30 made of soft magnetic material is designed from the geometrical shape of the magnetic head to be used, and specifically when using a recording head of a single-pole type writing head, the medium can be designed in a film thickness of about 50 nm to 1 $\mu$m, and in the case of ring type writing head, the medium can be designed in a film thickness of about 5 nm to 50 nm.

Further, the information recording medium of the invention may be manufactured by a sputter-deposition method. That is, one of the features of the manufacturing method of the information recording medium of the invention is that the layer structure of the magnetic recording medium is fabricated by sequentially forming the soft magnetic layer 30, nonmagnetic layer 20, and information recording layer 10 (10') of ordered alloy with $L1_0$ crystal structure selected from the following group A. That is, group A is defined to include FePt ordered alloy, CoPt ordered alloy, FePd ordered alloy, and their alloy.

Figure 8A:
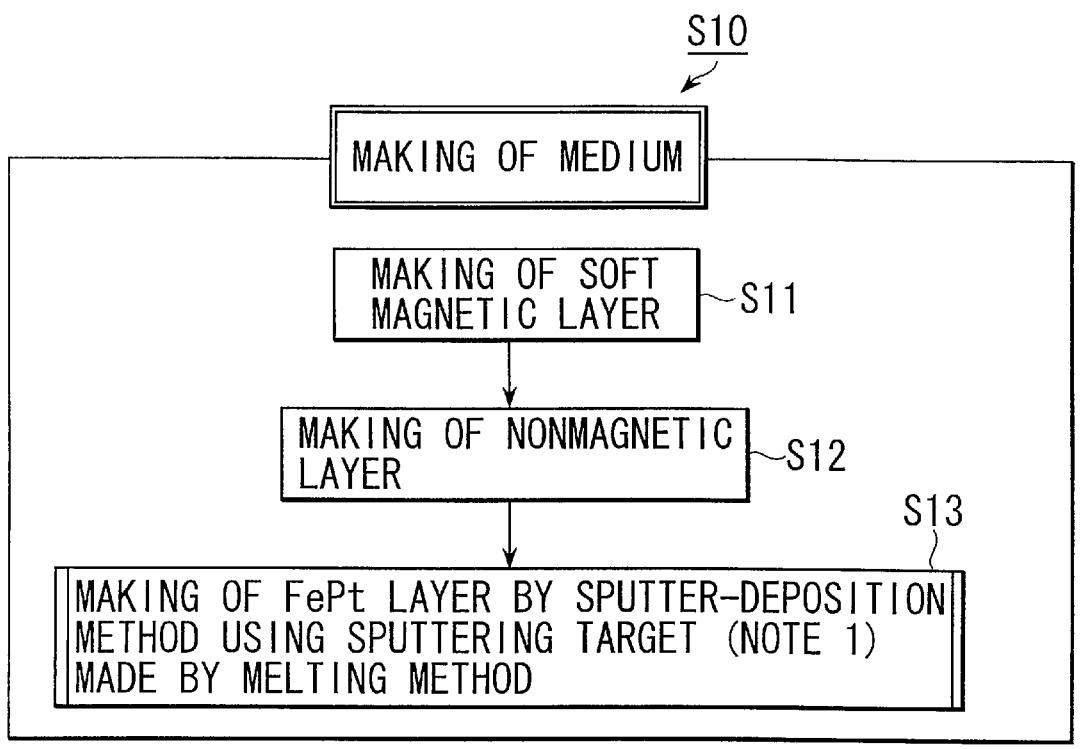
FIGS. 8A, 8B are flowcharts showing the manufacturing process and melting method for fabricating the information recording medium of the invention.
Figure 9A:
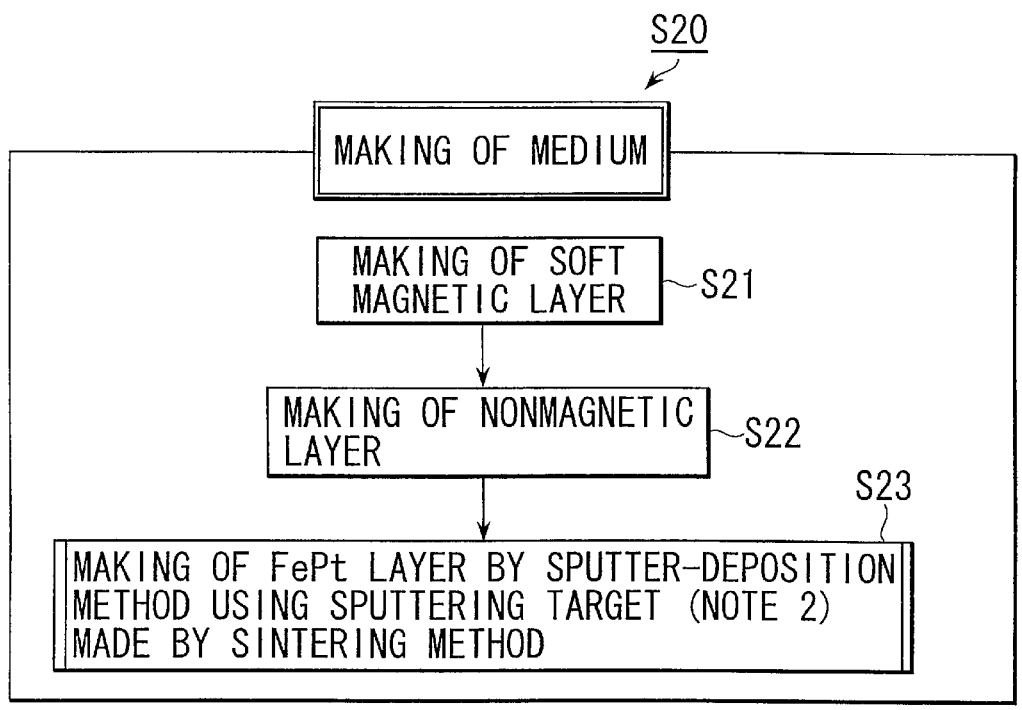
FIGS. 9A, 9B are flowcharts showing the manufacturing process and sintering method for fabricating the information recording medium of the invention.

Specifically, according to a series of process (S10, S20) for manufacturing the information recording medium of the invention shown in FIG. 8A and FIG. 9A, it is sequentially manufactured in the soft magnetic layer forming step (S11, S21), the nonmagnetic layer forming step (S12, S22), and the sputter-deposition forming step of FePt layer (S13, S23) by using the sputtering target pre-prepared by melting method (S13a to S13b) or other method, such as sintering method (S23a to S23c), as the information recording layer of ordered alloy with $L1_0$ crystal structure.

In this case, as the target used in fabrication of thin film of ordered alloy with $L1_0$ crystal structure, it is preferred to use the one prepared by the melting method, as compared with the one prepared by the sintering method, because the layer of ordered alloy with $L1_0$ crystal structure can be formed at a lower substrate temperature when forming the thin film.

Figure 8B:
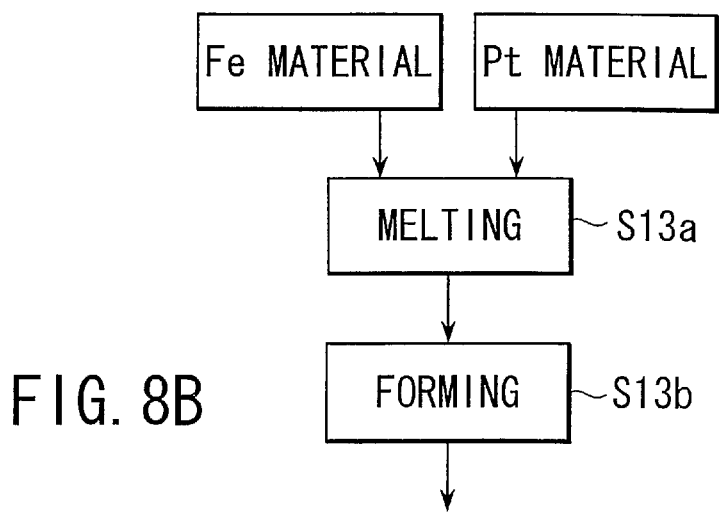

The sputtering target by the melting method is manufactured in the process shown in FIG. 8B. That is, when using FePt ordered alloy, using vacuum induction melting furnace or vacuum arc melting furnace, alloy materials Fe and Pt are heated over the melting point, melted and alloyed (S13a). The alloy obtained at this step may be pulverized and melted again to obtain a homogeneous composition. Thus obtained alloy is processed and formed into a specified size and shape to be used as the sputtering target (S13b). At this time of processing and forming, the composition and crystal grains may be homogenized by rolling or heat treatment below the melting point.

Figure 9B:
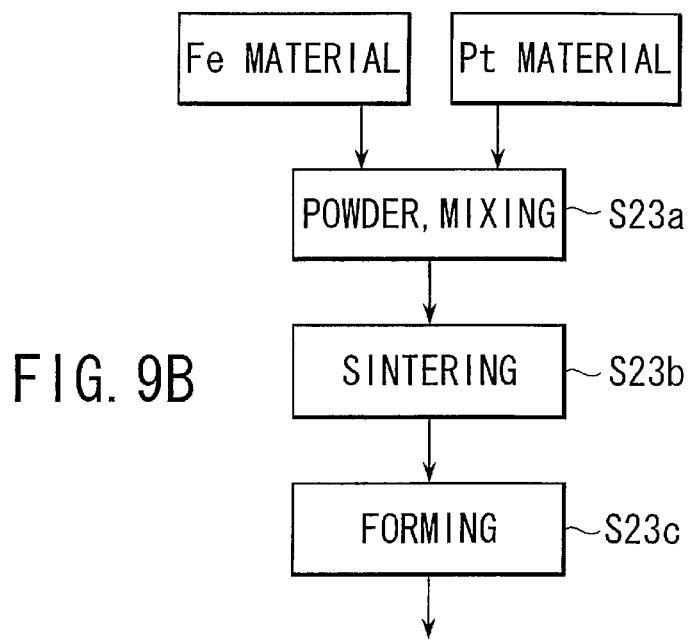
Figure 10A:
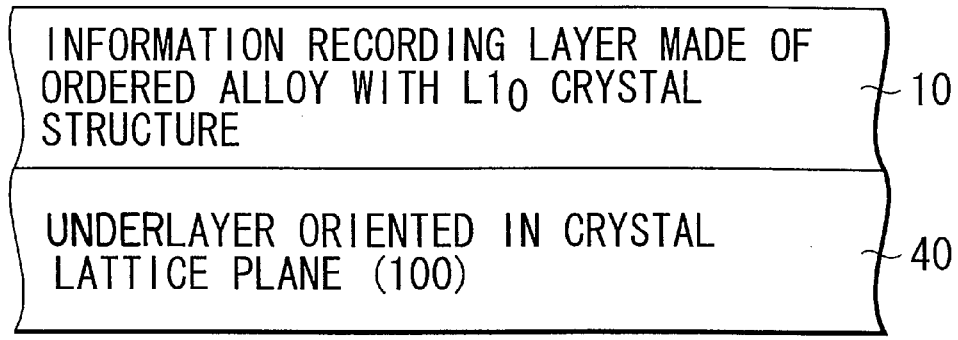
FIGS. 10A, 10B are basic layer structural diagrams of a conventional information recording medium.
Figure 10B:
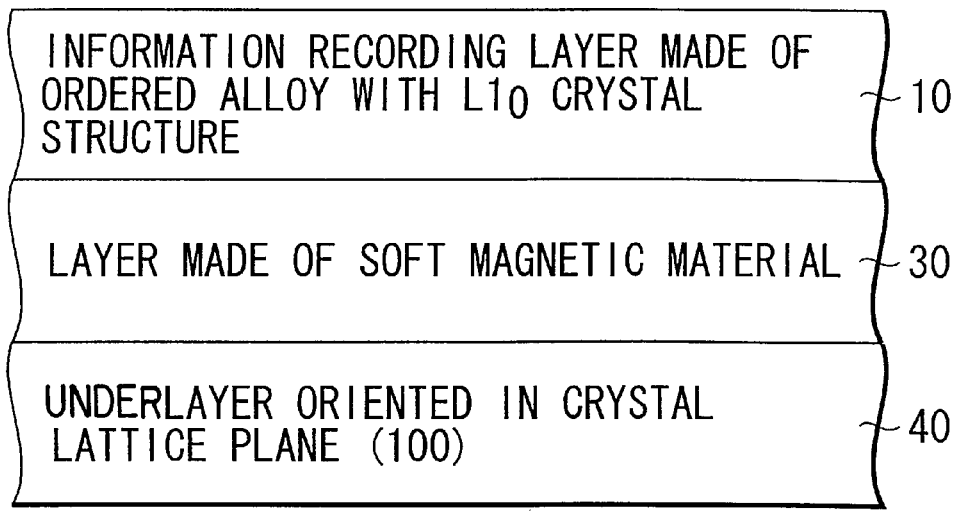

It is also possible to manufacture by sintering method, and the procedure of manufacturing the sputtering target by the sintering method is shown in FIG. 9B. That is, when using FePt ordered alloy, alloy materials Fe and Pt are once ground to powder for the ease of mixing, and obtained powder materials are mixed (S23a). Putting in a specified mold, the mixed powder is sintered under melting point while applying pressure, and this step is terminated when reaching a specified density (S23b). Later, to be used as sputtering target, it is processed and formed into a specified size and shape (S23c).

MODIFIED EXAMPLE 1

Alternatively, not limited to the sputter deposition method, the layer 30 of soft magnetic material can be manufactured, for example, by an electrochemical technique, or its function may be achieved by using a substrate made of soft magnetic material, for example, a ferrite substrate. Usable types of substrate in the invention are not particularly limited, and, for example, glass substrate, Si substrate, sapphire substrate and other ceramics can be used.

Method of Evaluation

The standard for evaluation of magnetic recording medium in the invention conforms to the following method of evaluation.

(1) The crystal structure is evaluated by X-ray diffraction method using Cu—K$\alpha$ ray. At this time, the crystal orientation is evaluated by measuring the rocking curve corresponding to the crystal lattice plane to be evaluated, and its half value width is obtained as the index. The forming amount of ordered phase is evaluated by the method proposed by T. Suzuki, N. Honda, and K. Ouchi (J. Magn. Soc. Jpn., 21-S2, 177, 1997), that is, the integrated intensity for fct (face-centered tetragonal) (001) line is divided by the film thickness, and the index is obtained.

(2) The magnetic characteristic is evaluated by measuring the hysteresis curve by using polar-Kerr effect, and obtaining the coercivity. The squareness of the loop is the ratio (Θr/Θm) of the Kerr rotation angle (Θr) in remanence state and the Kerr rotation angle (Θm) in the maximum applied magnetic field (13 kOe).

(3) The recording and reproducing characteristic is evaluated at the linear velocity of 5.08 m/s. When recording information in the double-layer perpendicular magnetic recording medium, the writing head is a thin film single-pole type head with the main pole thickness of 1 μm and track width of 10 μm, and when recording in the single-layer perpendicular magnetic recording medium, the writing head is a ring type head with the gap length of 0.15 μm and track width of 6.46 μm. In either case, the reproducing head is a magneto-resistive head with the shield gap length of 0.2 μm and track width of 1.2 μm, and signals are reproduced by using this head. The resolution is evaluated by measuring the signal output in relation to each recording density, and the recording density at half of the maximum signal output is defined as the index.

Specific embodiments of the invention are described below, and compared with the prior art according to the method of evaluation explained above, and the action and effect of the invention are discussed.

Embodiment 1

Figure 2A:
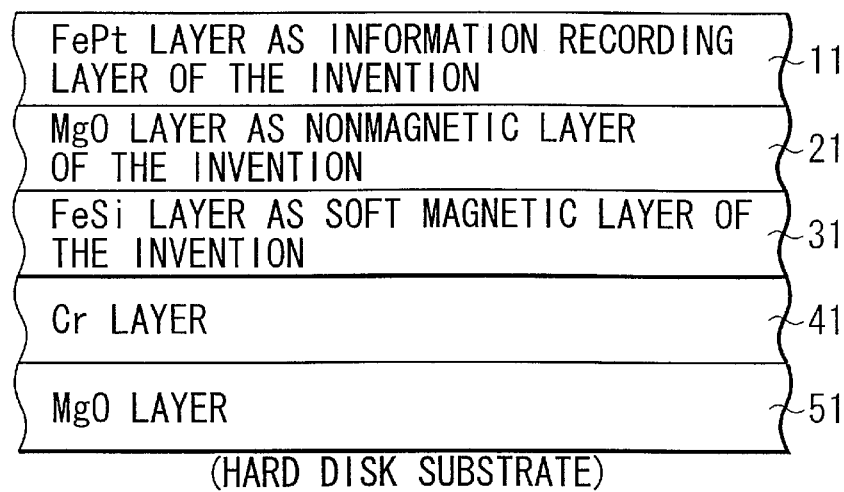
FIG. 2A is a layer structural diagram of an information recording medium in embodiment 1 of the invention.

The information recording medium in embodiment 1 of the invention has a layer structure as shown in FIG. 2A, sequentially including NgO layer 51, Cr layer 41, FeSi layer 31, MgO layer 21, and FePt layer 11. The layer structure is manufactured in the following procedure. That is, on a hard disk substrate, a 10 nm thick MgO layer is formed by RF-magnetron sputter deposition method, a 70 nm thick Cr layer by DC-magnetron sputter deposition method, a 500 nm FeSi layer as soft magnetic layer of the invention by DC-magnetron sputter deposition method, a 1 nm MgO layer as nonmagnetic layer of the invention by RF-magnetron sputter deposition method, and a 13 nm thick FePt layer as information recording layer of the invention by RF sputter deposition method by using FePt alloy sputtering target (Fe/Pt=1 at atomic composition ratio) prepared by melting method, in this sequence. At this time, the sputter-deposition condition of forming the FePt layer is substrate temperature of 300° C., sputering gas pressure of 50 Pa, and tar get-substrate distance of 95 mm. In all other layers, the sputter-deposition condition is substrate temperature of 50° C., sputtering gas pressure of 0.2 Pa, and target-substrate distance 50 mm.

Operation and Effect 1

Figure 3A:
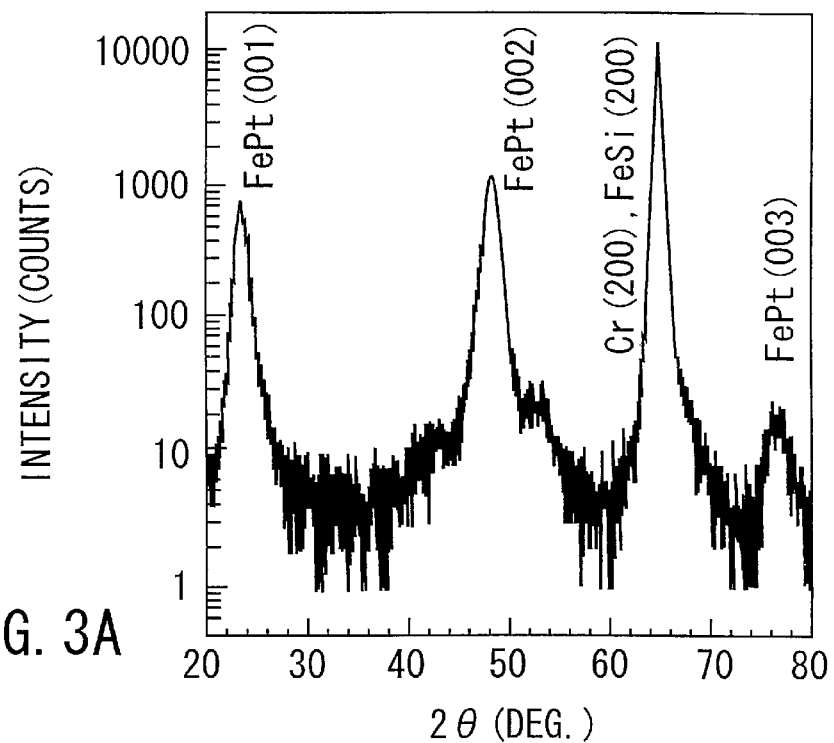
FIG. 3A is a graph showing an X-ray diffraction pattern of the information recording medium in embodiment 1.

FIG. 3A shows the X-ray diffraction pattern of the information recording medium manufactured in the method explained above. As shown in the diagram, the formation of FePt ordered alloy phase and its crystal orientation are diffraction patterns showing the Miller index (001) of the crystal lattice plane. The rocking curve half value width corresponding to the Miller index (001) of the crystal lattice plane of this FePt layer is 4.4 degrees, and it is known that the crystal orientation is excellent as compared with the information recording medium of comparative example 1 according to the prior art explained below. The coercivity is 4.6 kOe and the squareness is 1, and it is known that the squareness is particularly improved as compared with the information recording medium of comparative example 1 according to the prior art explained below.

Figure 3B:
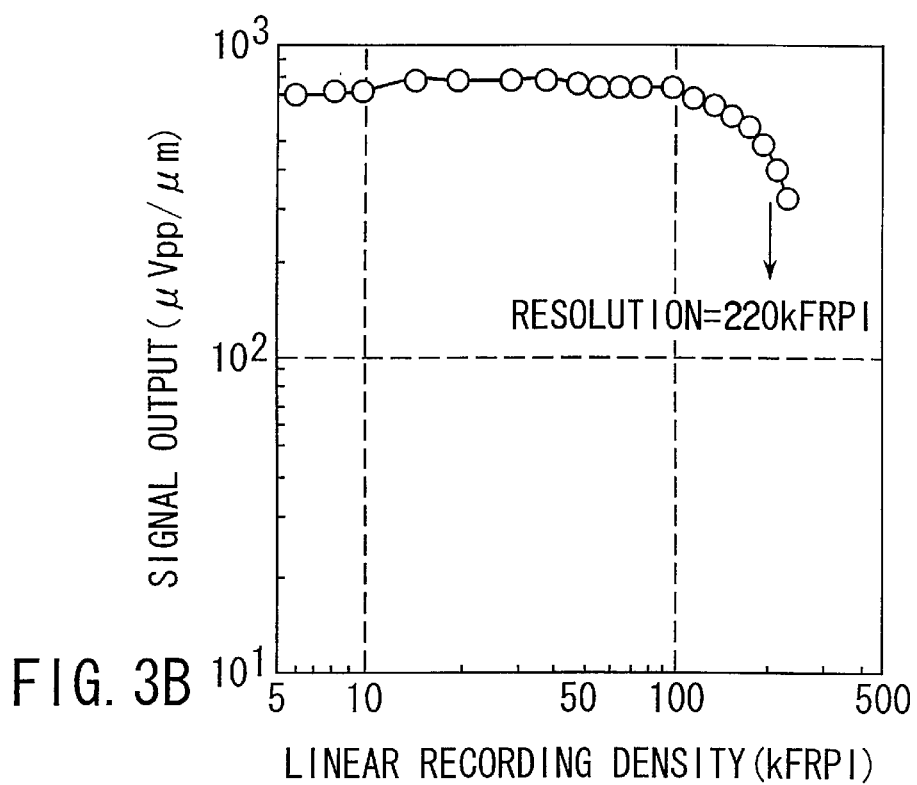
FIG. 3B is a graph showing recording density dependence (recording resolution) of recorded signal outputs of the information according medium in embodiment 1.

FIG. 3B shows results of evaluation of recording density characteristic of the information recording medium manufactured in the above method. As shown in the diagram, the information recording medium of the invention shows a higher signal output than the information recording medium of comparative example 1 or comparative example 2 explained below, and a high resolution of 220 k FRPI is obtained.

COMPARATIVE EXAMPLE 1

Figure 2B:
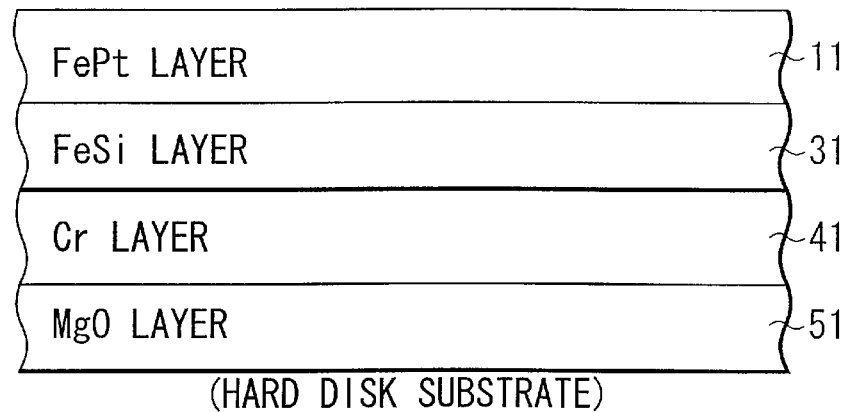
FIG. 2B is a layer structural diagram of an information recording medium in comparative example 1 corresponding to embodiment 1.

As one comparative example corresponding to the information recording medium of the invention, an example of manufacturing a double-layer perpendicular magnetic recording medium according to the following prior art having a layer structure shown in FIG. 2B is explained.

That is, the information recording medium similar to the information recording medium of embodiment 1 except that the nonmagnetic layer of the invention is not formed is prepared. That is, the recording medium of this comparative example 1 is a double-layer perpendicular magnetic recording medium of the conventional structure sequentially forming MgO layer 51, Cr layer 41, FeSi layer 31, and FePt layer 11 on a hard disk substrate. The forming condition of each layer is same in the sputter-deposition condition of each layer corresponding to embodiment 1. In this comparative example 1, the rocking curve half value width corresponding to the Miller index (001) of the crystal lattice plane of the FePt layer 11 is 6.1 degrees, and it is known that the crystal orientation is inferior to that of embodiment 1. The coercivity is 4.1 kOe and the squareness is 0.8, and in particular the squareness is extremely poor. On the other hand, the information recording medium of embodiment 1 is superior to this.

Figure 4A:
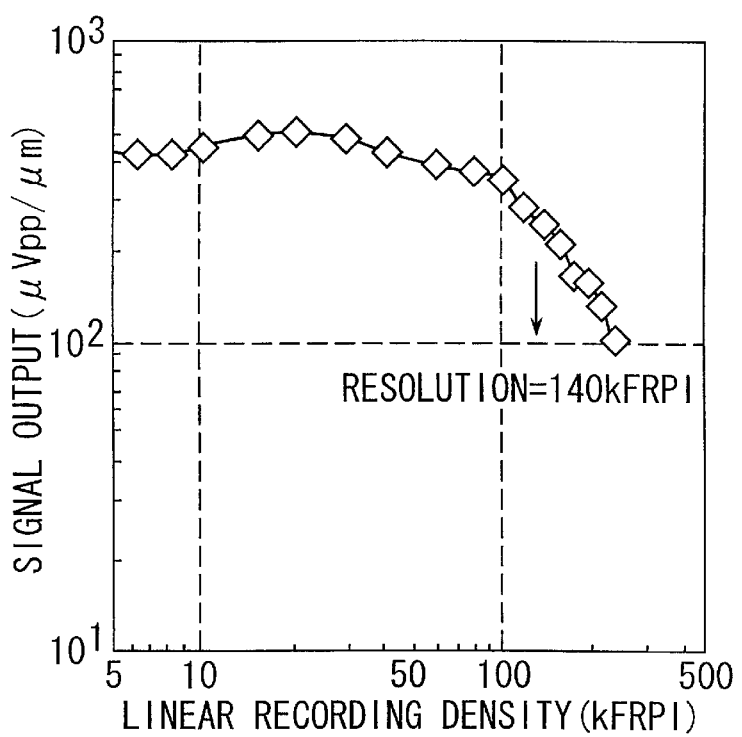
FIG. 4A is a graph showing recording density dependence (recording resolution) of recorded signal outputs of information recording medium in comparative example 1.

Or, as shown in FIG. 4A, the information recording medium of comparative example 1 is lower in signal output than in the information recording medium of embodiment 1, and further the resolution is extremely low at 140 k FRPI. On the other hand, it is evident that the information recording medium of embodiment 1 is excellent in both signal output and resolution.

COMPARATIVE EXAMPLE 2

Figure 2C:
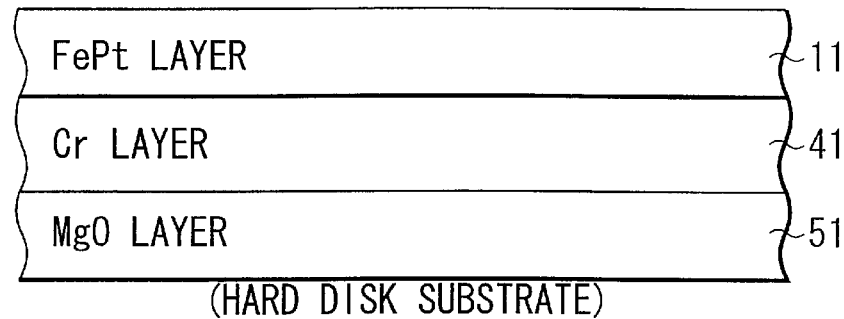
FIG. 2C is a layer structural diagram of an information recording medium in comparative example 2 corresponding to embodiment 1.

As another comparative example corresponding in the information recording medium of the invention, a single-layer perpendicular magnetic recording medium according to the following prior art having a layer structure shown in FIG. 2C is manufactured.

Figure 4B:
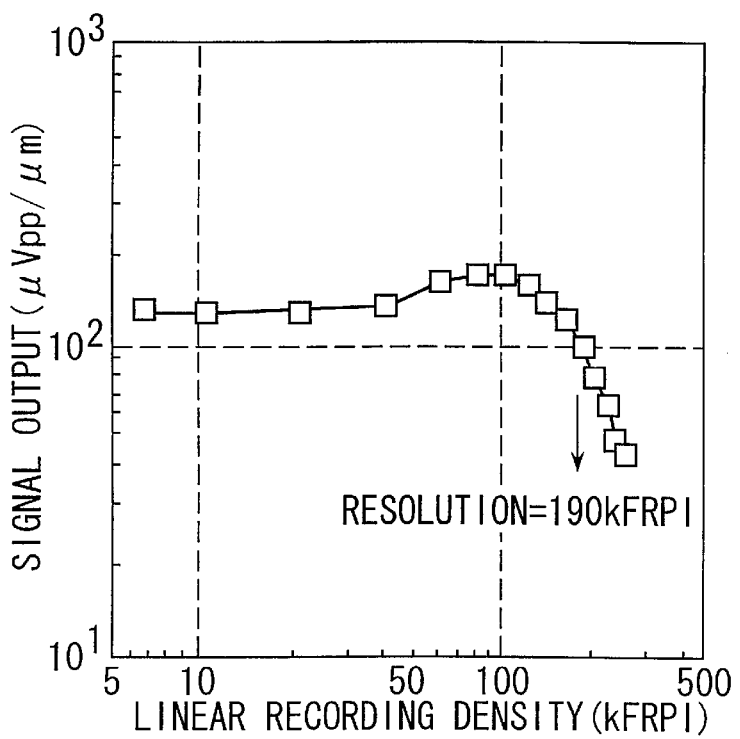
FIG. 4B is a graph showing recording density dependence (recording resolution) of recorded signal outputs of information recording medium in comparative example 2.

That is, the information recording medium similar to the information recording medium of embodiment 1 except that the soft magnetic layer and nonmagnetic layer of the invention are not formed is prepared. That is, the medium of this comparative example 2 is a single-layer perpendicular magnetic recording medium of the conventional structure sequentially forming MgO layer, Cr layer, and FePt layer on a hard disk substrate. The information recording medium of comparative example 2 is, as shown in FIG. 4B, extremely lower in signal output than in the information recording medium of embodiment 1, and further the resolution is extremely low at 190 k FRPI. Hence, by this comparison, too, the information recording medium of embodiment 1 is excellent in both signal output and resolution.

Embodiment 2

Figure 5:
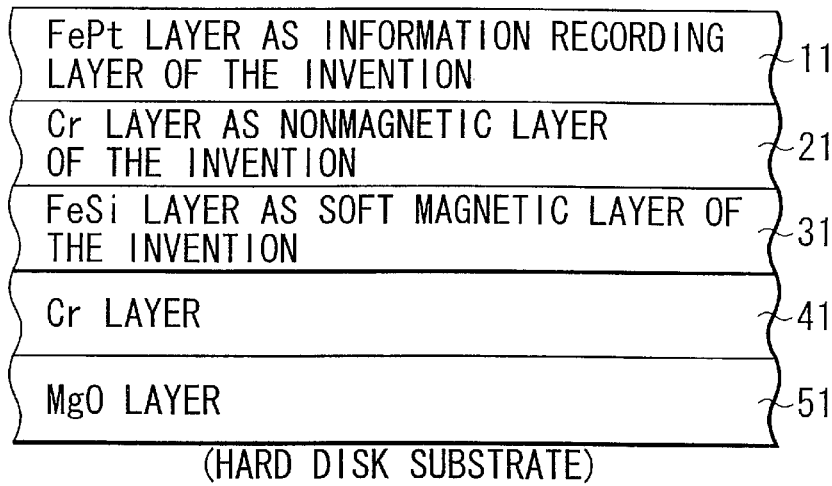
FIG. 5 is a layer structural diagram of an information recording medium in embodiment 2 of the invention.

FIG. 5 shows a layer structure of information recording medium in embodiment 2. In this example, instead of the nonmagnetic layer of the invention composing the information recording medium of embodiment 1 (FIG. 2A), a 10 nm thick Cr layer is used to fabricate the medium.

Operation and Effect 2

In the information recording medium of embodiment 2, the rocking curve half value width corresponding to the Miller index (001) of the crystal lattice plane of the FePt layer is 5.5 degrees, and the coercivity is 4.1 kOe, and it is known that the crystal orientation and coercivity are both increased as compared with those of comparative example 1 conforming to the prior art.

Embodiment 3

Similarly, as embodiment 3, a layer structure of information recording medium same as the information recording medium of embodiment 1 (FIG. 2A) of the invention is manufactured except that the thickness of the FePt layer is changed to 5 nm.

Operation and Effect 3

In the information recording medium of embodiment 3, the coercivity is 1.8 kOe. This value shows that the coercivity is larger than that of the information recording medium of comparative example 3 below having the same thickness of information recording medium. Therefore, the medium structure of the invention shows that the information recording medium can be used even at a thin film thickness of 5 nm.

COMPARATIVE EXAMPLE 3

Similar to the information recording medium of conventional structure in comparative example 1, the medium is manufactured by changing only the film thickness of the FePt layer to 5 nm. The coercivity of this medium is considerably small at 0.2 kOe, and it is difficult to use as recording medium. Therefore, in the medium structure of the double-layer perpendicular magnetic recording medium of the prior art, it is difficult to reduce the film thickness of the information recording layer to 5 nm.

In this aspect, the structure of embodiment 3 is excellent because it can be formed thinly.

Embodiment 4

Figure 6A:
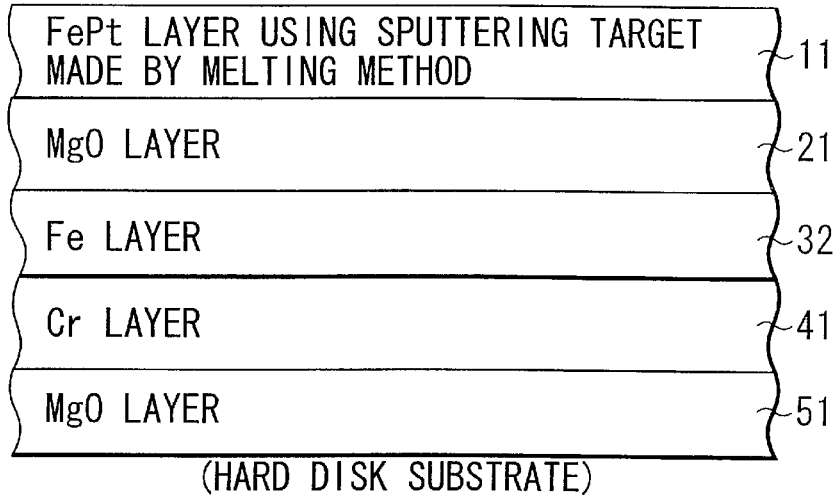
FIG. 6A is a layer structural diagram of an information recording medium made by the melting method in embodiment 4 of the invention.

FIG. 6A shows a layer structure of information recording medium in embodiment 4. In this example, the soft magnetic layer for composing the information recording medium in embodiment 1 (FIG. 2A) is changed to 500 nm Fe layer 32, and the film thickness of FePt layer 11 is changed to 43 nm, and the medium is manufactured in the same composition in other aspects. At this time, the FePt layer 11 as the information recording layer of the invention is manufactured by the rf sputter deposition method, by using the FePt alloy (Fe/Pt=1 as atomic composition ratio) sputtering target manufactured by melting method, at the sputtering gas pressure of 50 Pa, target-substrate distance of 50 mm, and substrate temperature varied at 200° C., 300° C., and 400° C.

Operation and Effect 4

Figure 7A:
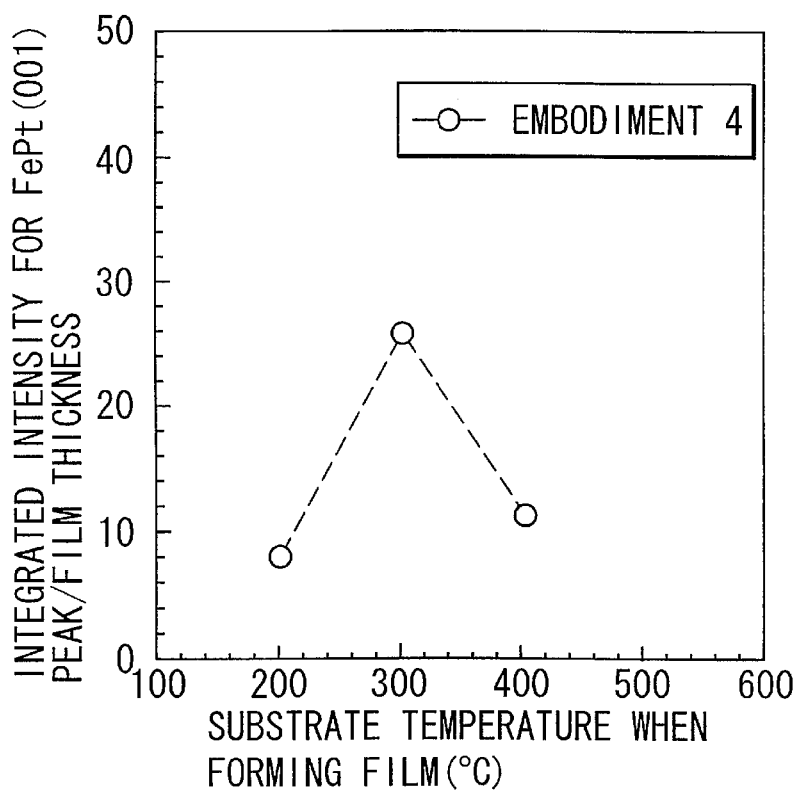
FIG. 7A is a graph showing the relation between the substrate temperature and forming amount of ordered phase of $L1_0$, when forming the film, in the information recording medium fabricated in embodiment 4.

FIG. 7A shows results of evaluation of forming amount of ordered phase in the FePt layer of each it medium manufactured according to embodiment 4. As shown in the diagram, as compared with the following comparative example 4, the ordered phase is formed at lower substrate temperature, and this information recording medium is known to be preferable for medium manufacturing process.

COMPARATIVE EXAMPLE 4

Figure 6B:
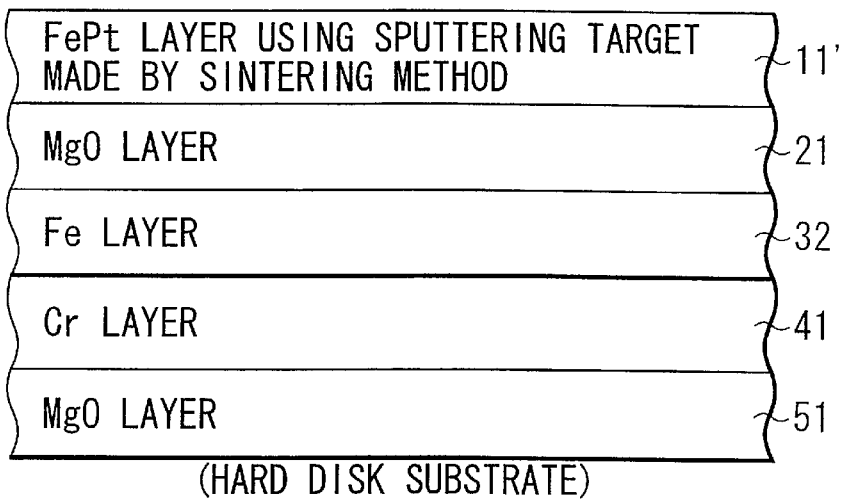
FIG. 6B is a layer structural diagram of an information recording medium made by the interning method in comparative example 4 corresponding to embodiment 4.

The information recording medium 11' of the invention, as shown in FIG. 6B, can be manufactured in the same method as that for composing the information recording medium of embodiment 4, except that f:the FePt layer is formed by using the FePt alloy (Fe/Pt=1 as atomic composition ratio) sputtering target manufactured by sintering method, at the substrate temperature varied at 300° C., 400° C., and 500° C.

Figure 7B:
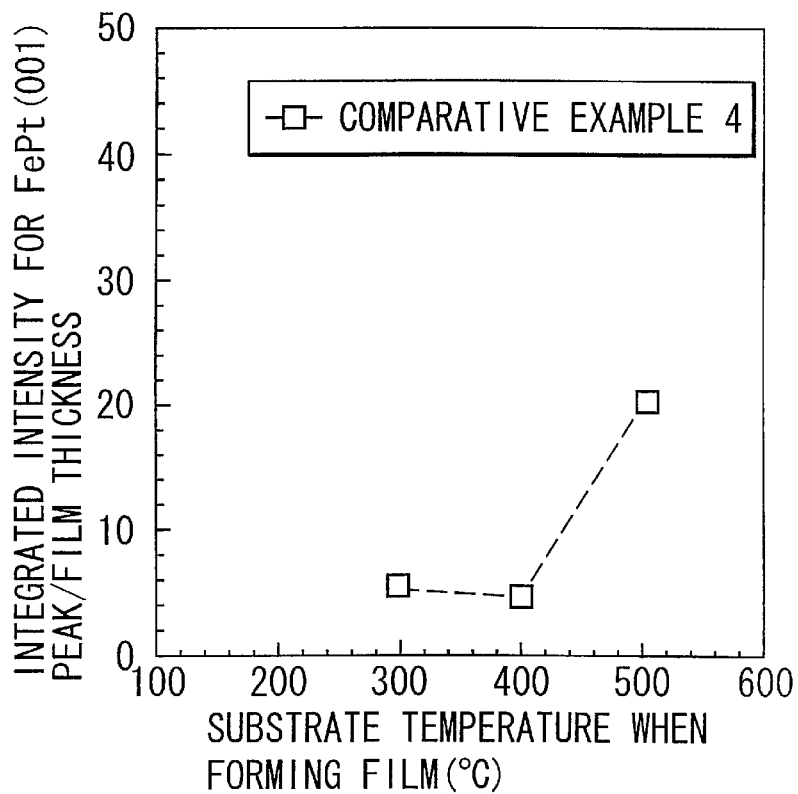
FIG. 7B is a graph showing the evaluation of forming amount of ordered phase in comparative example 4 corresponding to embodiment 4.

As shown in FIG. 7B, in the FePt layer in the medium fabricated according to comparative example 4, as compared with embodiment 4, it is known that a higher substrate temperature is required for forming the ordered phase. Hence, If the high temperature and related cost problem permit, such manufacturing method is also effective.

OTHER MODIFIED EXAMPLES

The invention has been explained so far by referring to the preferred embodiment and plural specific examples, but the invention is not limited to them alone, and, for example, the thickness of the formed layers may be properly varied and combined as far as the layer structure is substantially equivalent.

The invention may be also modified and changed in various forms in a range without departing from the true spirit of the invention.

Effects of the Invention

Thus, by using the information recording medium of the invention, a high signal output and a high resolution can be realized at the same time. Moreover, in the perpendicular magnetic recording medium of the invention, since the thin film of ordered alloy with $L1_0$ crystal structure large in magnetocrystalline anisotropy is used, a recording medium excellent in thermal stability is presented. Further, by the layer composed of nonmagnetic material, since the crystallinity, crystal orientation, and magnetic characteristic of the thin film of ordered alloy with $L1_0$ crystal structure are improved, the information recording layer can be formed in a thinner film, and it is expected to be a useful information recording medium for further high density recording.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An information recording medium comprising:
    (a) a layer structure sequentially forming a layer made of soft magnetic material;
    (b) a layer made of MgO; and
    (c) an information recording layer of ordered alloy with $L1_0$ crystal structure selected from the group consisting of FePt ordered alloy, CoPt ordered alloy, FePd ordered alloy, and alloys thereof.

2. The information recording medium according to claim 1, wherein the Miller index (001) of the crystal lattice plane of the information recording layer is formed to be parallel to the surface of said recording layer.

3. The information recording medium according to claim 1, wherein said soft magnetic material is selected from the group consisting of Fe, Fe—Si alloys and Ni—Fe alloy.

4. A manufacturing method for an information recording medium comprising sequentially fabricating a soft magnetic layer, a nonmagnetic layer, and an information recording layer of an ordered alloy with $L1_0$ crystal structure selected from the group consisting of FePt ordered alloy, CoPt ordered alloy, FePd ordered alloy, and alloys thereof, wherein said information recording layer of ordered alloy $L1_0$ crystal structure is fabricated by a sputter-deposition method at a substrate temperature of 400° C. or less, using a sputtering target manufactured by a melting method.

5. The information recording medium of claim 1, wherein said layer of MgO is not alloyed with either said soft magnetic material or with said information recording layer.

6. The information recording medium of claim 1, wherein said layer of MgO has a thickness of 10 nm or less.

7. An information recording medium in a layered structure sequentially comprising:
   (a) an underlayer consisting essentially of an element or compound selected from the group consisting of Cr, Pt, Pd, Au, Fe, Ni, MgO, and NiO, said element or compound controlled so that the Miller index (100) of its crystal lattice plane is parallel to the other adjacent layers;
   (b) a layer made of soft magnetic material;
   (c) a layer made of MgO; and
   (d) an information recording layer of ordered alloy with $L1_0$ crystal structure selected from the group consisting of FePt ordered alloy, CoPt ordered alloy, FePd ordered alloy, and alloys thereof.

8. An information recording medium in a layered structure sequentially comprising:
   (a) an underlayer consisting essentially of an element or compound selected from the group consisting of Cr, Pt, Pd, Au, Fe, Ni, MgO, and NiO, said element or compound controlled so that the Miller index (100) of its crystal lattice plane is parallel to the other adjacent layers;
   (b) a layer made of soft magnetic material, wherein said soft magnetic material is selected from the group consisting of Fe, Fe—Si alloy, and Ni—Fe alloy;
   (c) a layer made of MgO; and
   (d) an information recording layer of ordered alloy with $L1_0$ crystal structure selected from the group consisting of FePt ordered alloy, CoPt ordered alloy, FePd ordered alloy, and alloys thereof.

* * * * *